United States Patent
Chen et al.

(10) Patent No.: US 7,867,839 B2
(45) Date of Patent: Jan. 11, 2011

(54) METHOD TO REDUCE THRESHOLD VOLTAGE (VT) IN SILICON GERMANIUM (SIGE), HIGH-K DIELECTRIC-METAL GATE, P-TYPE METAL OXIDE SEMICONDUCTOR FIELD EFFECT TRANSISTORS

(75) Inventors: Xiangdong Chen, Poughquag, NY (US); Jong Ho Lee, Fishkill, NY (US); Weipeng Li, Beacon, NY (US); Dae-Gyu Park, Poughquag, NY (US); Kenneth J. Stein, Sandy Hook, CT (US); Voon-Yew Thean, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 12/176,634

(22) Filed: Jul. 21, 2008

(65) Prior Publication Data

US 2010/0013021 A1 Jan. 21, 2010

(51) Int. Cl.
*H01L 21/8238* (2006.01)

(52) U.S. Cl. ............ 438/217; 438/276; 438/287; 438/289; 257/E21.633; 257/E21.639

(58) Field of Classification Search ............ 438/216, 438/217, 275, 276, 287, 289; 257/E21.633, 257/E21.639
See application file for complete search history.

(56) References Cited

U.S. PATENT DOCUMENTS

| 6,972,224 | B2 * | 12/2005 | Gilmer et al. | 438/199 |
| 7,138,692 | B2 * | 11/2006 | Tamura et al. | 257/412 |
| 2008/0079086 | A1 * | 4/2008 | Jung et al. | 257/369 |
| 2009/0068812 | A1 * | 3/2009 | Prall et al. | 438/307 |

* cited by examiner

*Primary Examiner*—Julio J Maldonado
(74) *Attorney, Agent, or Firm*—Gibb I.P. Law Firm, LLC; Yuanmin Cai, Esq.

(57) ABSTRACT

Disclosed are embodiments of a p-type, silicon germanium (SiGe), high-k dielectric-metal gate, metal oxide semiconductor field effect transistor (PFET) having an optimal threshold voltage (Vt), a complementary metal oxide semiconductor (CMOS) device that includes the PFET and methods of forming both the PFET alone and the CMOS device. The embodiments incorporate negatively charged ions (e.g., fluorine (F), chlorine (Cl), bromine (Br), iodine (I), etc.) into the high-k gate dielectric material of the PFET only so as to selectively adjust the negative Vt of the PFET (i.e., so as to reduce the negative Vt of the PFET).

14 Claims, 7 Drawing Sheets

METHOD TO REDUCE THRESHOLD VOLTAGE (VT) IN SILICON GERMANIUM (SIGE), HIGH-K DIELECTRIC-METAL GATE, P-TYPE METAL OXIDE SEMICONDUCTOR FIELD EFFECT TRANSISTORS

BACKGROUND

1. Field of the Invention

The embodiments of the invention generally relate to p-type metal oxide semiconductor field effect transistors (PFETs) and, more specifically, to a silicon germanium (SiGe), high-k dielectric-metal gate, PFET structure with a reduced threshold voltage (Vt) and a method of forming the structure.

2. Description of the Related Art

As complementary metal oxide semiconductor (CMOS) devices are scaled in size, conventional gate stack structures are being replaced by metal gate stack structures. Specifically, a conventional gate stack structure typically includes a thin silicon oxide ($SiO_2$) gate dielectric layer and a doped-polysilicon gate conductor layer. Unfortunately, doped polysilicon gate conductor layers are subject to depletion effects. These depletion effects result in an increase in the effective gate dielectric layer thickness and, thereby limit device scaling. Thus, high-k dielectric layer-metal gate conductor layer stacks have been introduced. These stacks are improvements over the conventional gate stack structures in that the high-k-dielectric layer minimizes leakage current and the metal gate conductor layer is not subject to depletion effects. However, with ever smaller device sizes new concerns for future CMOS technology generations and, more particularly, for CMOS technology generations at or beyond the 65 nm node are introduced even with such high-k dielectric layer-metal gate conductor layer stacks. For example, the ability to control threshold voltage (Vt) in such devices is critical for device performance and such control has proved difficult, particularly in PFETs which suffer from high Vt. Therefore, there is a need in the art for PFET structure having an optimal Vt and method of forming the structure.

SUMMARY

In view of the foregoing, one embodiment of the present invention is a field effect transistor (FET), such as a p-type field effect transistor (PFET), having a selectively adjusted threshold voltage (Vt). This FET can comprise a substrate and a channel region in the substrate. A gate structure can be positioned on the substrate adjacent to the channel region. This gate structure can comprise a gate dielectric layer (e.g., a high-k gate dielectric) layer on the channel region and a gate conductor layer (e.g., a metal gate conductor layer) above the gate dielectric layer. The gate dielectric layer can further comprise a predetermined concentration of a dopant material having charged ions so that the FET has a predetermined threshold voltage. Specifically, in the case of a PFET, this dopant material can comprise, for example, fluorine with negatively charged ions. The introduction of negatively charge ions into the PFET gate dielectric layer will effectively reduce the negative Vt of the PFET (i.e., move the Vt in a positive direction towards zero).

Another embodiment of the present invention is a complementary metal oxide semiconductor (CMOS) device that incorporates the above-described PFET. Specifically, this CMOS device can comprise a substrate. The CMOS device can further comprise a PFET and an n-type field effect transistor (NFET). As discussed above, the PFET can comprise a first channel region in the substrate. A first gate stack can be positioned above the first channel region. This first gate stack can comprise a first high-k gate dielectric layer on the substrate adjacent to the first channel region and a first gate conductor layer (e.g., a metal gate conductor layer) above the first gate dielectric layer. The first high-k gate dielectric layer can comprise a predetermined concentration of a dopant material having negatively charged ions (e.g., fluorine) so that the PFET has a predetermined negative threshold voltage. The NFET can similarly comprise a second channel region in the substrate. A second gate stack can be positioned above the second channel region. This second gate stack can comprise a second high-k gate dielectric layer on the substrate adjacent to the second channel region and a second gate conductor layer (e.g., a second metal gate conductor layer) above the second high-k gate dielectric layer. However, in the case of the NFET, the second high-k gate dielectric layer can be devoid of the dopant material so as not to increase the positive Vt of the NFET.

Also disclosed are method embodiments for forming the above-described FET and CMOS device. Specifically, an embodiment of a method for forming the above-described FET can comprise providing a substrate and forming a gate stack, comprising a gate dielectric layer and a gate conductor layer, on the substrate adjacent to a designated channel region in the substrate. Either before the stack is formed or at some point after it is formed, an implant process is performed using a dopant material having charged ions. Then, additional processing is performed in order to complete the FET. This additional processing must include the performance of at least one thermal process that will cause a predetermined concentration of the implanted dopant material to diffuse into the gate dielectric layer in order to selectively adjust the threshold voltage of the resulting field effect transistor.

An embodiment of a method for forming the above-described CMOS device similarly can comprise providing a substrate. Gate stacks, each comprising a gate dielectric layer (e.g., a high-k gate dielectric layer) and a gate conductor layer (e.g., a metal gate conductor layer), are formed on a first region of a substrate adjacent to a designated first channel region for a p-type field effect transistor (PFET) and also on a second region of the substrate adjacent to a designated second channel region for an n-type field effect transistor (NFET). Either before the gate stacks are formed or at some point after they are formed, the second region of the substrate is masked and an implant process is performed using a dopant material having negatively charged ions (e.g., fluorine). Then, additional processing is performed to complete the PFET and the NFET. This additional processing must include the performance of at least one thermal process to cause a predetermined concentration of the dopant material to diffuse into the high-k gate dielectric layer of the gate stack on the first region of the substrate in order to selectively reduce the negative Vt of the PFET (i.e., to move the negative Vt of the PFET in a more positive direction towards zero).

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

Figure 1:
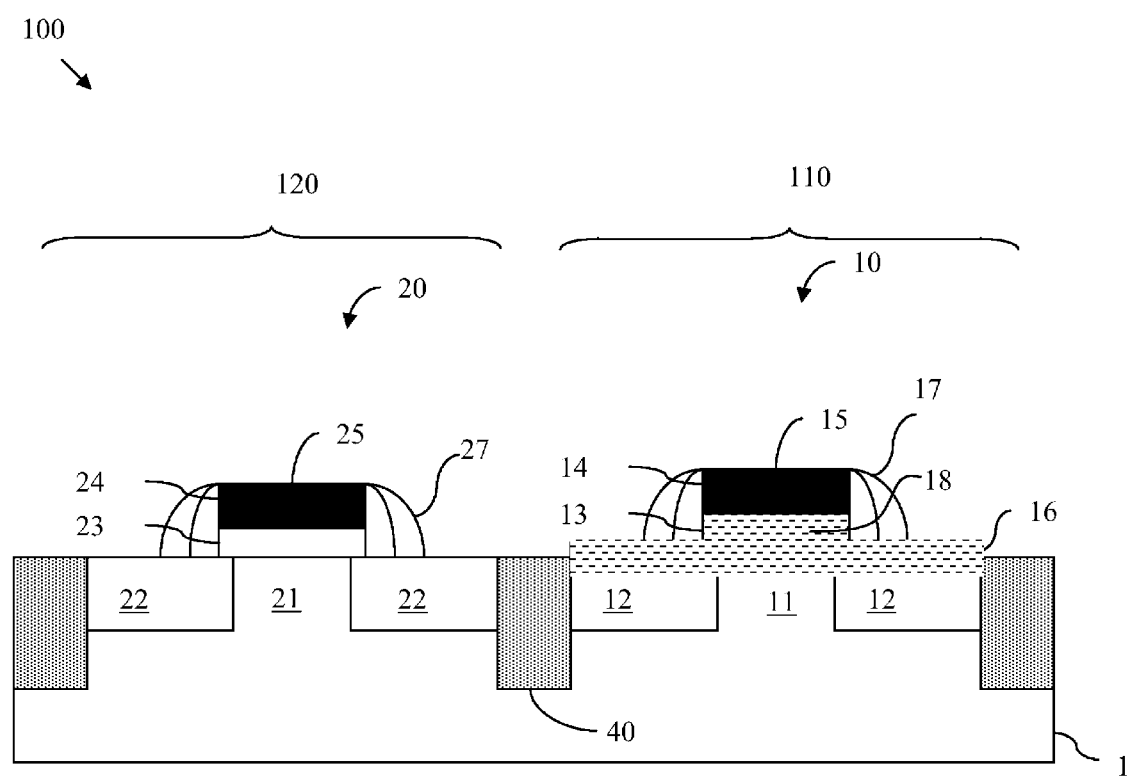
FIG. 1 is a cross-section diagram illustrating embodiments of the field effect transistor (FET) and complementary metal oxide semiconductor (CMOS) device of the present invention.

The embodiments of the invention and the various features and advantageous details thereof are explained more fully with reference to the non-limiting embodiments that are illustrated in the accompanying drawings and detailed in the following description.

As mentioned above, with scaling of complementary metal oxide semiconductor (CMOS) devices are scaled in size, conventional gate stack structures are being replaced by metal gate stack structures. Specifically, a conventional gate stack structure typically includes a thin silicon oxide ($SiO_2$) gate dielectric layer and a doped-polysilicon gate conductor layer. Unfortunately, doped polysilicon gate conductor layers are subject to depletion effects. These depletion effects result in an increase in the effective gate dielectric layer thickness and, thereby limit device scaling. Thus, high-k dielectric layer-metal gate conductor layer stacks have been introduced. These stacks are improvements over the conventional gate stack structures in that the high-k-dielectric layer minimizes leakage current and the metal gate conductor layer is not subject to depletion effects. However, with ever smaller device sizes new concerns for future CMOS technology generations and, more particularly, for CMOS technology generations at or beyond the 65 nm node are introduced even with such high-k dielectric layer-metal gate conductor layer stacks. For example, the ability to control threshold voltage (Vt) in such devices is critical for device performance and such control has proved difficult, particularly in PFETS which suffer from high negative Vt.

One technique that has recently been used to reduce the high negative Vt of PFETs (i.e., to move the threshold voltage in a positive direction) is the use of a gate structure with a work function specific to PFETs (i.e., near the valence band). This work function can be achieved through the use of different gate metals and/or different high-k gate dielectrics. However, the negative Vt of such PFETs is still higher than optimal for performance.

Another technique that has recently been used to reduce the high negative Vt of PFETs (i.e., to move the threshold voltage in a positive direction) involves adjusting the energy band of the channel region. For example, silicon germanium (SiGe) introduced into the channel material of PFETS adjusts the energy band gap more towards zero and, thereby reduces the negative threshold voltage. However, again, the negative Vt of such PFETs is still higher than optimal for performance. The germanium concentration of the SiGe in the channel region can be increased to further adjust the Vt, however, with a greater concentration of Ge comes a greater Vt temperature sensitivity.

In view of the foregoing, disclosed here are embodiments of a p-type, silicon germanium (SiGe), high-k dielectric-metal gate, metal oxide semiconductor field effect transistor (PFET) having an optimal threshold voltage (Vt), a complementary metal oxide semiconductor (CMOS) device that includes the PFET and methods of forming both the PFET alone and the CMOS device. The embodiments incorporate negatively charged ions (e.g., fluorine (F), chlorine (Cl), bromine (Br), iodine (I), etc.) into the high-k gate dielectric material of the PFET so as to selectively adjust the negative Vt of the PFET (i.e., so as to reduce the negative Vt of the PFET).

Specifically, referring to FIG. 1, one embodiment of the present invention is a field effect transistor (FET) 10 having a selectively adjusted threshold voltage (Vt). This FET 10 can comprise a substrate 1 (e.g., a bulk silicon wafer, as shown, or silicon-on-insulator (SOI) wafer). A channel region 11 in the substrate 1 is between p-type source/drain regions 12 (i.e., source/drain regions doped with a p-type dopant, such as boron (B)).

Optionally, if the FET 10 comprises a PFET, the channel region 11 can comprise a silicon germanium layer 16 at the top surface of the substrate 1. As mentioned above, introduction of silicon germanium (SiGe) into the channel 11 material of a PFET adjusts the energy band gap more towards zero and, thereby reduces the negative Vt. However, the negative Vt of such silicon germanium PFETs is still higher than optimal for performance. Therefore, the present invention introduces an improved gate stack structure 15 that further allows for selective Vt adjustment.

The gate structure 15 can be positioned on the substrate 1 adjacent to the channel region 11. This gate structure 15 can comprise a gate dielectric layer 13 immediately adjacent to the channel region 11. The gate dielectric layer 13 can, for example, comprise a high-k gate dielectric material. Exemplary high-k dielectric materials include, but are not limited to, hafnium-based materials (e.g., $HfO_2$, HfSiO, HfSiON, or HfAlO) or some other suitable high-k dielectric material (e.g., $Al_2O_3$, $TaO_5$, $ZrO_5$, etc.) having a dielectric constant "k" above 3.9 (i.e., above the dielectric constant of $SiO_2$).

A gate conductor layer 14 can be positioned above the gate dielectric layer 13. This gate conductor layer 14 can, for example, comprise a single gate conductor layer (e.g., a single metal gate conductor layer or a single doped polysilicon layer). Alternatively, this gate conductor layer 14 can comprise multiple stacked gate conductor layers (e.g., a metal gate conductor layer-doped silicon and/or doped polysilicon layer stack). If the FET 10 comprises a PFET, the gate conductor layer 14 preferably comprises at least one metal gate conductor layer and this at least one metal gate conductor layer comprises a near valence band metal (e.g., rhenium, rhenium oxide, platinum, ruthenium, ruthenium oxide, nickel, palladium, iridium, etc.). However, it should be understood that even if the FET 10 comprises a PFET, this gate conductor layer 14 can comprise other types of metals, such as near conduction band metals optimal for n-type field effect transistor (NFET) performance (e.g., titanium nitride, titanium silicon nitride, tantalum nitride, tantalum silicon nitride, aluminum, silver, hafnium, etc.).

In addition, the gate dielectric layer 13 of the present invention can further comprise a predetermined concentration of a dopant material 18 having charged ions so that the FET has a predetermined threshold voltage (Vt). For example, if the FET 10 comprises a PFET, this dopant material 18 can comprise fluorine or some other dopant material with negatively charged ions (e.g., chlorine, bromine, iodine, etc.). The introduction of negatively charge ions into a PFET gate dielectric layer 13 will, for example, effectively reduce the negative Vt of the PFET (i.e., move the Vt of the PFET in a positive direction towards zero). Specifically, the introduction of negatively charged fluorine ions into the gate dielectric layer of a PFET such that the concentration of fluorine ions is between $1\times10^{12}$ atoms/cm$^2$ and $1\times10^{13}$ atoms/cm$^2$ at the gate dielectric layer 13-semiconductor substrate 1 interface can change the negative Vt of the PFET by anywhere between 50 mV and 500 mV, depending upon the implant dose and energy used, in order achieve the optimum PFET Vt of between −0.3V and −0.45V. It should be noted that, depending upon the technique used to introduce the dopant material 18 into the gate dielectric layer 13, the dopant material 18 may also be present within the substrate 1 (as illustrated), the optional silicon germanium layer 16 (as illustrated), the gate conductor layer 14 and/or one or more gate sidewall spacers 17.

Referring again to FIG. 1, another embodiment of the present invention is a complementary metal oxide semiconductor (CMOS) device 100 that incorporates the above-described FET 10. Specifically, this CMOS device 100 can comprise a substrate 1 (e.g., a bulk silicon wafer, as shown, or a silicon-on-insulator (SOI) wafer). The CMOS device 100 can further comprise two FETs 10 and 20 and, more particularly, a PFET 10 and an n-type field effect transistor (NFET) 20. The FETs 10 and 20 can be isolated from each other by conventional shallow trench isolation (STI) structures 40.

The PFET 10 can comprise a first channel region 11 in the substrate 1 between p-type source/drain regions 12 (i.e., source/drain regions doped with a p-type dopant, such as boron (B)). Optionally, the first channel region 11 of the PFET 10 can comprise a silicon germanium layer 16 at the top surface of the substrate 1. As mentioned above, introduction of silicon germanium (SiGe) into the channel material of a PFET adjusts the energy band gap more towards zero and, thereby reduces the negative Vt. However, the negative Vt of such silicon germanium PFETs is still higher than optimal for performance. Therefore, the present invention introduces an improved gate structure 15 that further allows for selective Vt adjustment.

Specifically, the PFET 10 can comprise a first gate stack 15 can be positioned above the first channel region 11. This first gate stack 15 can comprise a first high-k gate dielectric layer 13 on the substrate 1 adjacent to the first channel region 11 and a first gate conductor layer 14 (e.g., a first metal gate conductor layer) above the first gate dielectric layer 13.

The first high-k gate dielectric layer 13 can comprise a predetermined concentration of a dopant material having negatively charged ions (e.g., fluorine, chlorine, bromine, iodine, etc.) so that the PFET 10 has a predetermined negative threshold voltage. Again, the introduction of negatively charged fluorine ions into the gate dielectric layer of a PFET such that the concentration of fluorine ions is between $1\times10^{12}$ atoms/cm$^2$ and $1\times10^{13}$ atoms/cm$^2$ at the gate dielectric layer 13-semiconductor substrate 1 interface can change the negative Vt of the PFET by anywhere between 50 mV and 500 mV, depending upon the implant dose and energy used, in order achieve the optimum PFET Vt of between −0.3V and −0.45V. It should be noted that, depending upon the technique used to introduce the dopant material 18 into the gate dielectric layer 13, the dopant material 18 may also be present within the substrate 1 (as illustrated), the optional silicon germanium layer 16 (as illustrated), the gate conductor layer 14 and/or one or more gate sidewall spacers 17.

The NFET 20 can similarly comprise a second channel region 21 in the substrate 1 between n-type source/drain regions 22 (e.g., source/drain regions doped with an n-type dopant, such as phosphorous (P), arsenic (As) or antimony (Sb)). In the case of the NFET, the channel region 21 (i.e., the second channel region) is optimally a silicon channel region as opposed to a silicon germanium channel region. A second gate stack 25 can be positioned above the second channel region 21. This second gate stack 25 can comprise a second high-k gate dielectric layer 23 on the substrate 1 adjacent to the second channel region 21 and a second gate conductor layer 24 (e.g., a second metal gate conductor layer) above the second high-k gate dielectric layer 23. However, in the case of the NFET 20, the second high-k gate dielectric layer 23 can be devoid of the dopant material 18 so as not to increase the positive Vt of the NFET 20.

Exemplary high-k dielectric materials for the PFET 10 and NFET 20 can include, but are not limited to, hafnium-based materials (e.g., $HfO_2$, HfSiO, HfSiON, or HfAlO) or some other suitable high-k dielectric material (e.g., $Al_2O_3$, $TaO_5$, $ZrO_5$, etc.) having a dielectric constant "k" above 3.9 (i.e., above the dielectric constant of $SiO_2$). It should be noted that the first gate dielectric layer 13 of the gate stack 15 for the PFET 10 and the second gate dielectric layer 23 of the gate stack 25 for the NFET 20 can comprise the same high-k dielectric material or different high-k dielectric materials. Furthermore, regarding the gate conductor layers 14 and 24, preferably the first gate conductor layer 14 of the PFET 10 comprises at least one first metal gate conductor layer comprising a near valence band metal (e.g., rhenium, rhenium oxide, platinum, ruthenium, ruthenium oxide, nickel, palladium, iridium, etc.), whereas the second gate conductor layer 24 comprises at least one second metal gate conductor layer comprising a near conduction band metal (e.g., titanium nitride, titanium silicon nitride, tantalum nitride, tantalum silicon nitride, aluminum, silver, hafnium, etc.). However, it should be understood that, alternatively, the first and second gate conductor layers 14 and 24 of the PFET 10 and NFET 20 can comprise the same metals.

Figure 2:
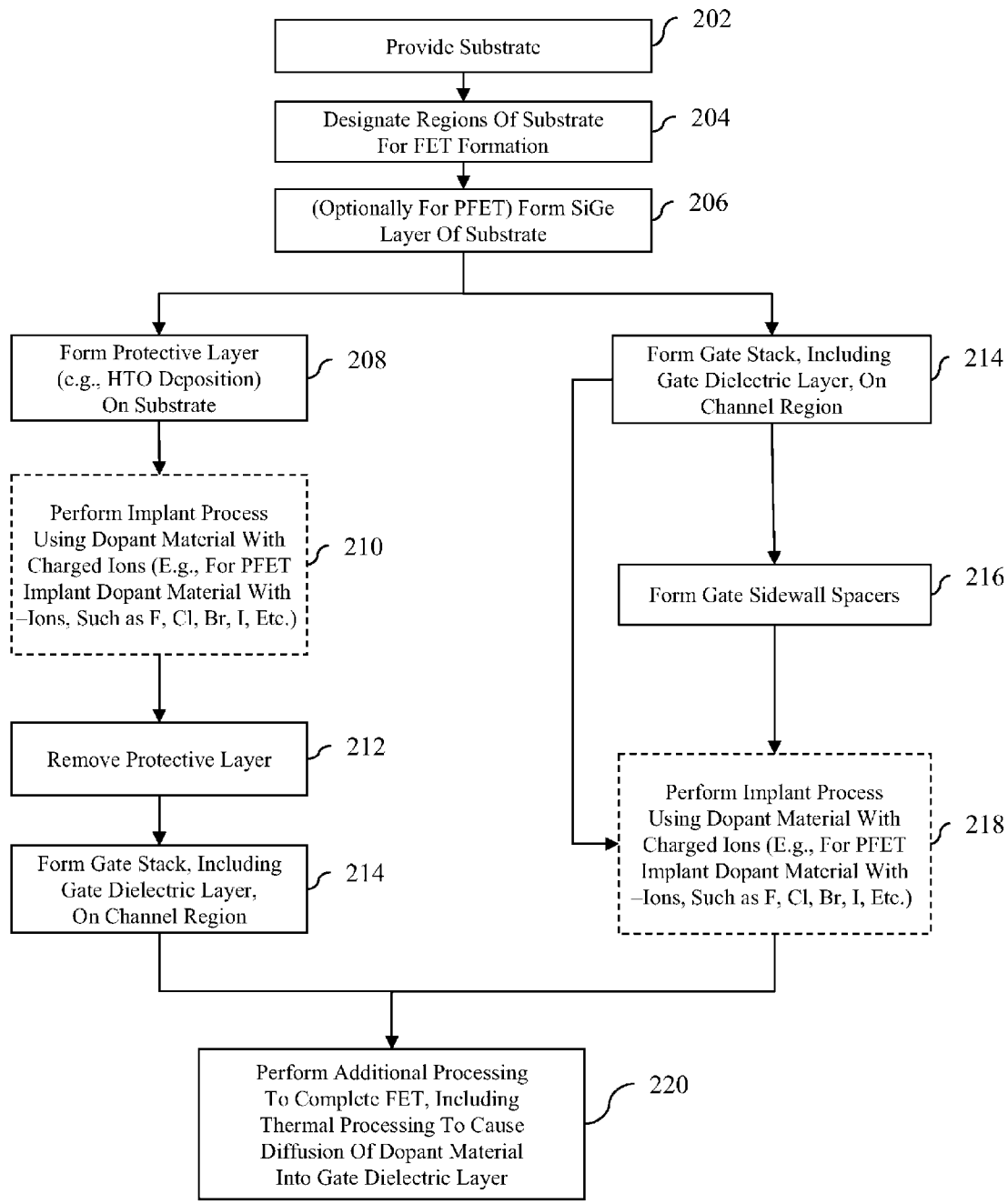
FIG. 2 is a flow diagram illustrating an embodiment of a method of forming the FET of FIG. 1.
Figure 3:
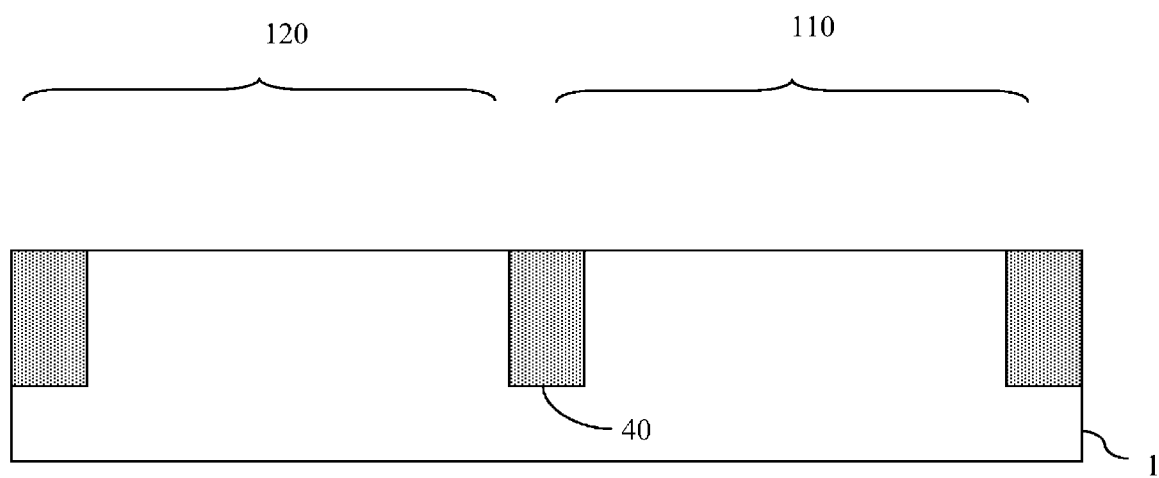
FIG. 3 is a cross-section diagram illustrating a partially completed structure of FIG. 1.
Figure 4:
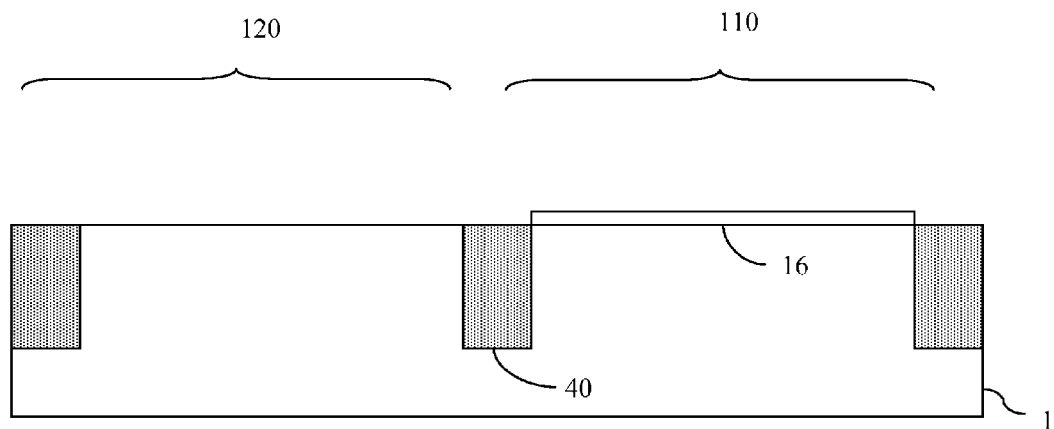
FIG. 4 is a cross-section diagram illustrating a partially completed structure of FIG. 1.

Also disclosed are method embodiments for forming the above-described FET 10 and CMOS device 100. Specifically, referring to FIG. 2, an embodiment of a method for forming the above-described FET 10 can comprise providing a substrate 1 (e.g., a bulk silicon substrate or silicon-on-insulator (SOI) substrate) (202). Next, regions 110, 120 of the substrate 1 are designated for FET formation (204, see FIG. 3). This can be accomplished, for example, by the formation of conventional shallow trench isolation (STI) regions 40.

Optionally, if the FET 10 is being formed as a PFET, a silicon germanium layer 16 can be formed at the top surface of the substrate 1 in region 110 (206). This process 206 can be accomplished by masking the region 120 and using conventional epitaxial deposition techniques to form the silicon germanium layer 16 on the substrate 1 in region 110. As mentioned above, introduction of silicon germanium (SiGe) into the channel material of a PFET will adjust the energy band gap more towards zero and, thereby reduce the negative Vt of the PFET. However, the negative Vt of such silicon germanium PFETs is still higher than optimal for performance. Therefore, the present invention introduces an improved FET formation method that allows for selective Vt adjustment via a gate structure.

Next, a gate stack 15, including a gate dielectric layer 13 (e.g., a high-k gate dielectric layer) and a gate conductor layer 14 (e.g., a metal gate conductor layer, a doped polysilicon gate conductor layer, or a metal gate conductor layer-doped silicon layer and/or doped polysilicon layer stack) is formed on the substrate 1 adjacent to a designated channel region 11 in region 110 of the substrate 1 (214, see FIG. 1). In the resulting FET 10 structure, as illustrated in FIG. 1, the gate dielectric layer 13 is doped with a predetermined concentration of a dopant material having charged ions. Doping of the gate dielectric layer 13 can be accomplished in a number of different manners.

Figure 7:
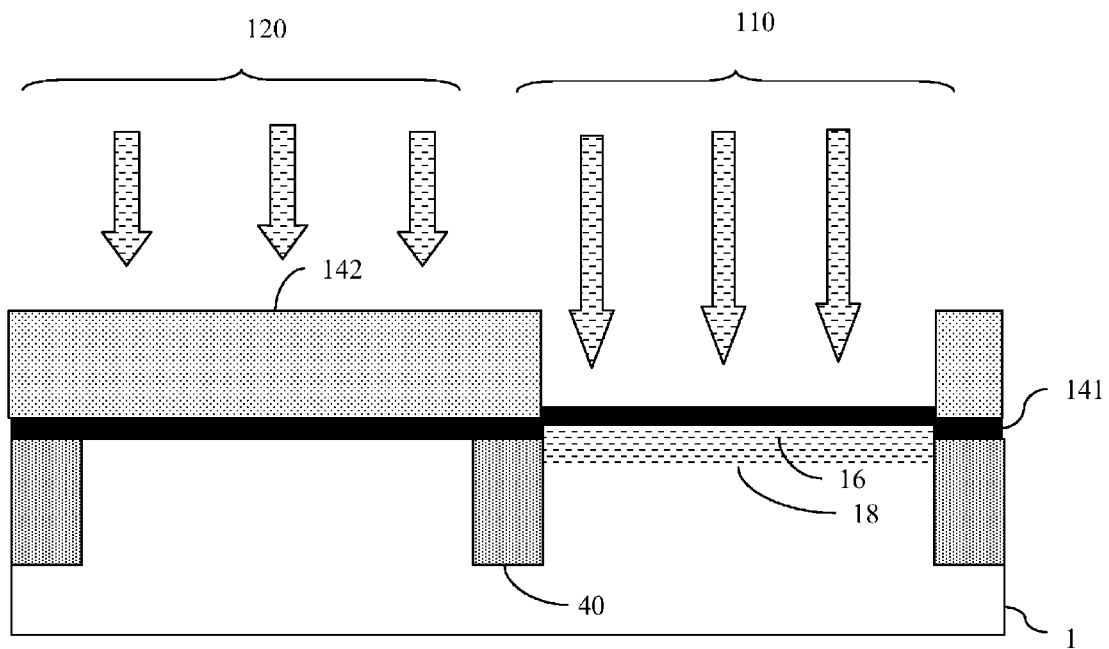
FIG. 7 is a cross-section diagram illustrating a partially completed structure of FIG. 1.
Figure 8:
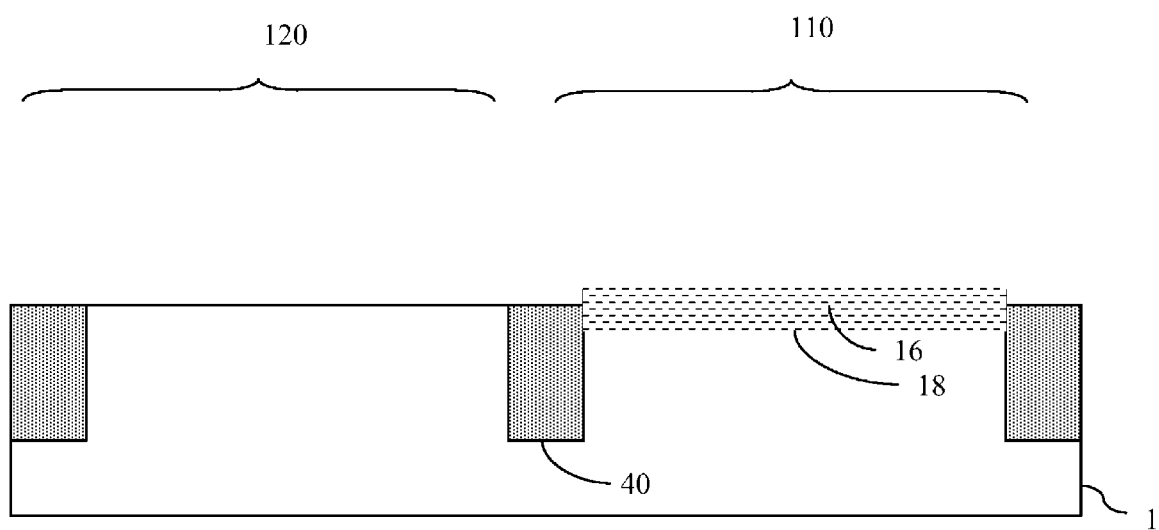
FIG. 8 is a cross-section diagram illustrating a partially completed structure of FIG. 1.

For example, before the gate stack 15 is formed, an implant process can be performed (210). More specifically, a protective layer 141 can be formed on the substrate 1 (and, if applicable, on the silicon germanium layer 16) (208, see FIG. 5). This protective layer 141 can be formed, for example, by a high temperature oxide (HTO) deposition process. Then, a dopant material 18 having charged ions can be implanted through the protective layer 141 into the optional silicon germanium layer 16 and substrate 1 (210, see FIG. 7). Specifically, if the FET 10 being formed is to be a PFET, then the charged ions can comprise negatively charged ions and the dopant material 18 can, for example, comprise any one or more of fluorine, chlorine, bromine, iodine, etc. The dose and energy used for this implant process 210 are predetermined so as to ensure that following additional FET processing at process 220 (see discussion below) the dopant material 18 will diffuse into and achieve a predetermined concentration in the gate dielectric layer 13. The protective layer 141 protects the top surface of the substrate 1 (or, if applicable, the top surface of the silicon germanium layer 16) from damage during the implant process. Once the implant process 210 is performed, the protective layer 141 can be removed (212, see FIG. 8).

Alternatively, instead of performing the above-described implant process before the formation of the gate stack 15, this implant process (i.e., implantation of a dopant material 18 having charged ions) can be performed immediately after the formation of the gate stack 15 adjacent to the channel region 11 or after the formation any one of the multiple layers of gate sidewall spacers 17 (214-218, see FIG. 1).

Regardless of which implant technique is used (i.e., before or after gate stack formation) additional processing is performed in order to complete the FET 10 structure (220, see FIG. 1). This additional processing can include, but is not limited to, halo implantation, source/drain extension implantation, source/drain 12 implantation, gate sidewall spacer 17 formation, silicide formation, etc.). However, this additional processing 220 must include the performance of at least one thermal process (e.g., a rapid thermal anneal (RTA) process) that will cause the implanted dopant material 18 to diffuse into and achieve a predetermined concentration within the gate dielectric layer 13 in order to selectively adjust the Vt of the resulting FET 10. For example, if the dopant material has negatively charged ions (e.g., is fluorine, chlorine, bromine, iodine, etc.) and if the additional processing is performed so that the FET 10 is completed as a PFET, then the negatively charged ions of the dopant material in the gate dielectric layer 13 will effectively reduce the negative Vt of the PFET. It should be noted that by tuning the dose and energy of the dopant material implanted (e.g., at processes 210 or 218), the Vt can be selectively adjusted. For example, tuning the dose (e.g., between $1 \times 10^{14}$ atoms/cm$^2$ and $1 \times 10^{16}$ atoms/cm$^2$) and also the energy used to implant fluorine into a PFET structure can result a predetermined concentration of fluorine ions of between $1 \times 10^{12}$ atoms/cm$^2$ and $1 \times 10^{13}$ atoms/cm$^2$ at the gate dielectric layer 13-semiconductor substrate 1 interface and can, thereby, adjust the negative Vt of the PFET by anywhere between 50 mV and 500 mV, depending upon the implant dose and energy used, in order achieve the optimum PFET Vt of between −0.3V and −0.45V.

Figure 9:
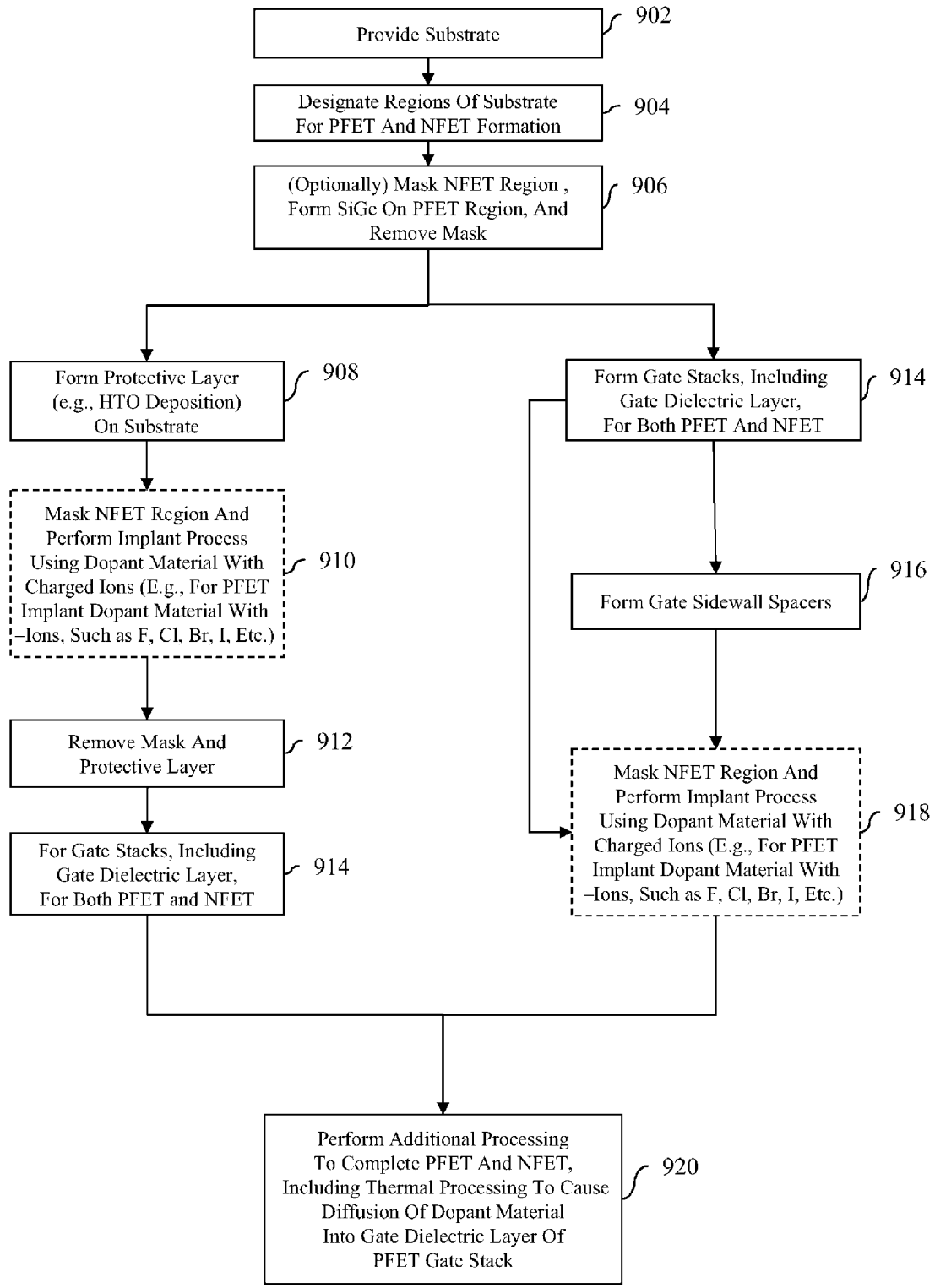
FIG. 9 is a flow diagram illustrating an embodiment of a method of forming the CMOS device of FIG. 1.

Referring to FIG. 9, an embodiment of a method for forming the above-described CMOS device 100 similarly can comprise providing a substrate 1 (e.g., a bulk silicon substrate or silicon-on-insulator (SOI) substrate) (902). Next, regions 110, 120 of the substrate 1 are designated for PFET and NFET formation, respectively (904, see FIG. 3). This can be accomplished, for example, by the formation of conventional shallow trench isolation (STI) regions 40.

Again, optionally, a silicon germanium layer 16 can be formed at the top surface of the first region 110 (i.e., the PFET region) of the substrate 1 (906). This process 906 can be accomplished by masking the region 120 and using conventional epitaxial deposition techniques to form the silicon germanium layer 16 on the substrate 1 in region 110. As mentioned above, introduction of silicon germanium (SiGe) into the channel material of a PFET will adjust the energy band gap more towards zero and, thereby reduce the negative Vt of the PFET. However, the negative Vt of such silicon germanium PFETs is still higher than optimal for performance. Therefore, the present invention introduces a CMOS device formation method that allows for selective Vt adjustment PFETs and/or NFETs via their respective gate structures.

Next, in this embodiment of the present invention gate stacks 15, 25, each comprising a gate dielectric layer 13, 23 (e.g., a high-k gate dielectric layer) and a gate conductor layer 14, 24 (e.g., a metal gate conductor layer, a doped polysilicon gate conductor layer, or a metal gate conductor layer-doped silicon layer and/or doped polysilicon layer stack ), are formed on the first region 110 of the substrate 1 adjacent to a designated first channel region 11 for a p-type field effect transistor (PFET) 10 and also on a second region 120 of the substrate 1 adjacent to a designated second channel region 21 for an n-type field effect transistor (NFET) 20 (914, see FIG. 1).

Conventional processing techniques may be used to form the gate stacks 15, 25 at process 914. Exemplary high-k dielectric materials that may be used to form the gate dielectric layers 13, 23 include, but are not limited to, hafnium-based materials (e.g., HfO$_2$, HfSiO, HfSiON, or HfAlO) or some other suitable high-k dielectric material (e.g., Al$_2$O$_3$, TaO$_5$, ZrO$_5$, etc.) having a dielectric constant "k" above 3.9 (i.e., above the dielectric constant of SiO$_2$). It should be noted that the gate dielectric layer 13 in the gate stack 15 for the PFET 10 and the gate dielectric layer 23 in the gate stack 25 for the NFET 20 can be formed with the same high-k dielectric material or different high-k dielectric materials. Furthermore, regarding the gate conductor layers 14 and 24, preferably the gate conductor layer 14 of the gate stack 15 for the PFET 10 is formed with at least one first metal gate conductor layer comprising a near valence band metal (e.g., rhenium, rhenium oxide, platinum, ruthenium, ruthenium oxide, nickel, palladium, iridium, etc.), whereas the gate conductor layer 24 of the gate stack 25 for the NFET 20 comprises at least one second metal gate conductor layer comprising a near conduction band metal (e.g., titanium nitride, titanium silicon nitride, tantalum nitride, tantalum silicon nitride, aluminum, silver, hafnium, etc.). However, it should be understood that, alternatively, the gate conductor layers 14 and 24 of the PFET 10 and NFET 20, respectively, can comprise the same metals.

In the resulting CMOS 100, the gate dielectric layer 13 of the PFET 10 only is doped with a predetermined concentration of a dopant material having negatively charged ions. Doping of the gate dielectric layer 13 can be accomplished in a number of different manners.

Figure 5:
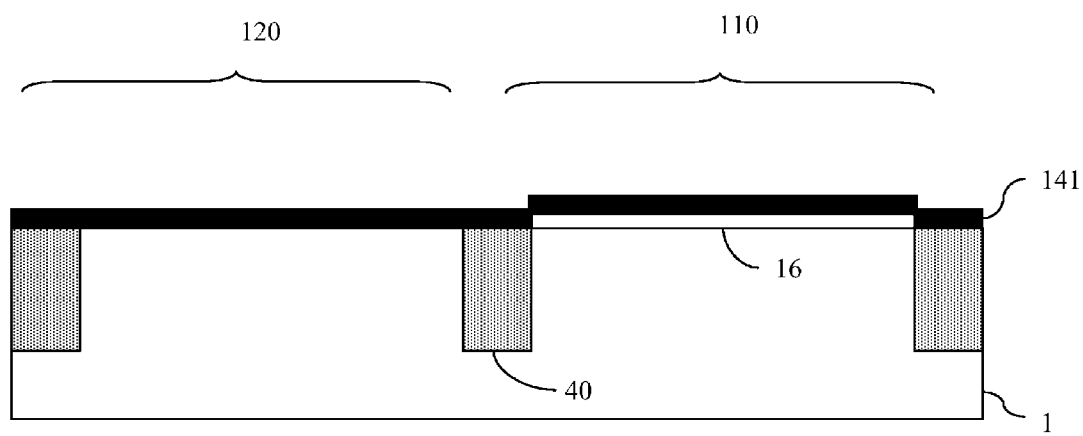
FIG. 5 is a cross-section diagram illustrating a partially completed structure of FIG. 1.
Figure 6:
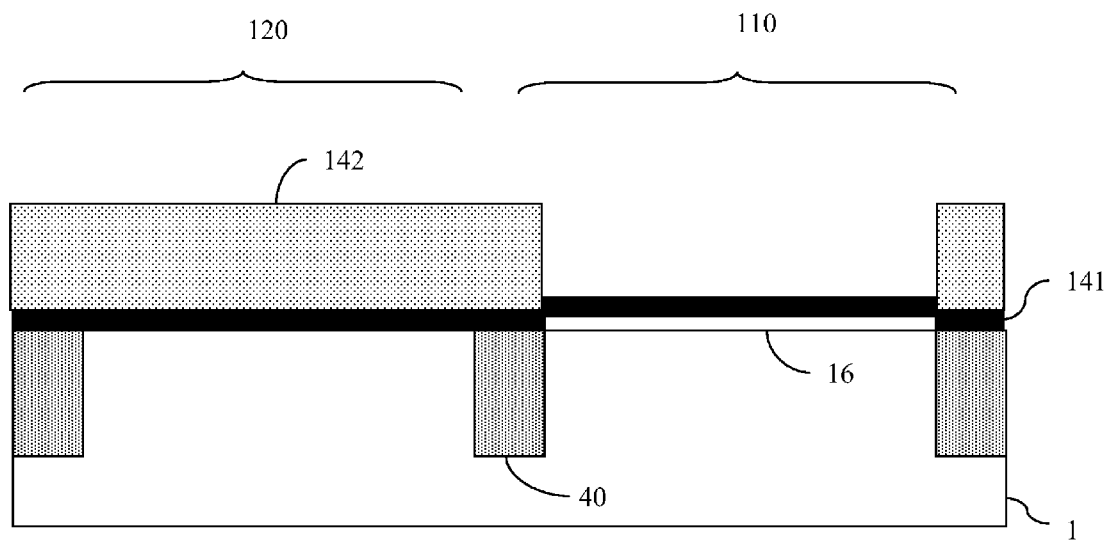
FIG. 6 is a cross-section diagram illustrating a partially completed structure of FIG. 1.

For example, before the gate stacks 15, 25 are formed at process 914, a protective layer 141 can be formed across the substrate 1 (and, if applicable, on the silicon germanium layer 16) (908, see FIG. 5). This protective layer 141 can be formed, for example, by a high temperature oxide (HTO) deposition process. Then, a mask layer 142 (e.g., a lithographically patterned resist layer) can be formed over the second region 120 of the substrate and a dopant material 18 having negatively charged ions can be implanted through the protective layer 141 into the optional silicon germanium layer 16 and substrate 1 (910, see FIGS. 6-7). This dopant material 18 can, for example, comprise any one or more of fluorine, chlorine, bromine, iodine, etc. The dose and energy used for this implant process 910 are predetermined so as to ensure that following additional PFET and NFET processing at process 920 (see discussion below) the dopant material 18 will diffuse into and achieve a predetermined concentration in the gate dielectric layer 13 of the gate stack 15 on the first region of the substrate 1. The protective layer 141 protects the top surface of the substrate 1 (or, if applicable, the top surface of the silicon germanium layer 16) from damage during the implant process. The mask 142 prevents the charged dopant material 18 from entering the second region 120 (i.e., the NFET region) of the substrate 1. Once the implant process 910 is performed, the mask 142 and protective layer 141 can be removed (912, see FIG. 8).

Alternatively, instead of performing the above-described implant process before the formation of the gate stacks 15, 25, the second region 120 of the substrate 1 can be masked and the implant process (i.e., implantation of a dopant material having negatively charged ions) can be performed immediately after the formation of the gate stacks 15, 25 or after the formation any one of the multiple layers of gate sidewall spacers 17, 27 (914-918, see FIG. 1).

Regardless of which implant technique is used (i.e., before or after gate stack formation) additional processing is performed in order to complete the PFET 10 and NFET 20 structures (920, see FIG. 1). This additional processing can include, but is not limited to, halo implantation, source/drain extension implantation, source/drain 12, 22 implantation, gate sidewall spacer 17, 27 formation, silicide formation, etc.). However, this additional processing 920 must include the performance of at least one thermal process (e.g., a rapid thermal anneal (RTA) process) that will cause the implanted dopant material 18 to diffuse into and achieve a predetermined concentration within the gate dielectric layer 13 of the gate stack 15 for the PFET 10 on the first region 110 of the substrate 1 in order to selectively adjust the Vt of the resulting PFET 10 and, more specifically, to selectively reduce the negative Vt of the PFET 10 (i.e., to move the negative Vt of the PFET in a more positive direction towards zero). It should be noted that by tuning the dose and energy of the dopant material implanted (e.g., at processes 910 or 918), the Vt can be selectively adjusted. For example, tuning the dose (e.g., between $1 \times 10^{14}$ atoms/$cm^2$ and $1 \times 10^{16}$ atoms/$cm^2$) and energy used to implant fluorine into a PFET structure can result a predetermined concentration of fluorine ions of between $1 \times 10^{12}$ atoms/$cm^2$ and $1 \times 10^{13}$ atoms/$cm^2$ at the gate dielectric layer 13-semiconductor substrate 1 interface and can, thereby, adjust the negative Vt of the PFET by anywhere between 50 mV and 500 mV, depending upon the implant dose and energy used, in order achieve the optimum PFET Vt of between −0.3V and −0.45V.

As described above and illustrated in the Figures, the embodiments of the present invention can be used to selectively adjust and, more specifically, to selectively reduce the negative Vt of a PFET alone or a PFET incorporated into a CMOS device. However, it should be understood that the technique may also be used to selectively adjust the positive Vt of an NFET alone or of an NFET incorporated into a CMOS device.

It should further be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of a p-type, silicon germanium (SiGe), high-k dielectric-metal gate, metal oxide semiconductor field effect transistor (PFET) having an optimal threshold voltage (Vt), a complementary metal oxide semiconductor (CMOS) device that includes the PFET and methods of forming both the PFET alone and the CMOS device. The embodiments incorporate negatively charged ions (e.g., fluorine (F), chlorine (Cl), bromine (Br), iodine (I), etc.) into the high-k gate dielectric material of the PFET so as to selectively adjust the negative Vt of the PFET (i.e., so as to reduce the negative Vt of the PFET).

What is claimed is:

1. A method of forming a p-type field effect transistor, said method comprising:

providing a substrate having a top surface;

forming a silicon germanium layer on said top surface of said substrate;

forming a gate stack on said silicon germanium layer, said gate stack comprising a high-k gate dielectric layer in contact with said silicon germanium layer above a designated channel region;

one of before said forming of said gate stack and after said forming of said gate stack, performing an implant process using a dopant material having negatively charged ions; and performing additional processing to complete said field effect transistor, said performing of said additional processing comprising performing at least one thermal process so as to cause said dopant material to diffuse into said gate dielectric layer leaving a predetermined concentration of said dopant material at an interface between said gate dielectric layer and said silicon germanium layer in order to selectively adjust a threshold voltage of said field effect transistor to between −0.3V and −0.45V, said performing of said implant process comprising, before said forming of said gate dielectric layer:

forming a protective layer on said substrate;

implanting said dopant material through said protective layer into said silicon germanium layer without damaging said silicon germanium layer; and removing said protective layer, said at least one thermal process causing said dopant material to diffuse directly from said silicon germanium layer into said gate dielectric layer.

2. The method according to claim 1, said forming of said protective layer comprising performing a high temperature oxide deposition process.

3. The method according to claim 1, further comprising, after said forming of said gate stack and before said performing of said implant process, forming at least one layer of sidewall spacers adjacent to opposing sidewalls of said gate stack.

4. The method according to claim 1, said performing of said additional processing comprising performing additional processing to complete a p-type field effect transistor and said negatively charged ions at said interface effectively reducing a negative threshold voltage of said p-type field effect transistor.

5. The method according to claim 4, said dopant material comprising any of chlorine, bromine and iodine.

6. The method according to claim 1, said dopant material comprising fluorine and said predetermined concentration being between $1\times10^{12}$ atoms/cm$^2$ and $1\times10^{13}$ atoms/cm$^2$.

7. The method according to claim 1, said gate stack further comprising a metal gate conductor layer on said high-k gate dielectric layer.

8. A method of forming a complementary metal oxide semiconductor device, said method comprising:

providing a substrate having a top surface;

forming a silicon germanium layer on said top surface over a first region of said substrate, but not over a second region of said substrate;

forming a first gate stack for a p-type field effect transistor on said silicon germanium layer over said first region and a second gate stack for an n-type field effect transistor on said substrate over said second region, said first gate stack comprising a high-k gate dielectric layer in contact with said silicon germanium layer above a designated channel region for said p-type field effect transistor;

one of before said forming of said first gate stack and said second gate stack and after said forming of said first gate stack and said second gate stack, masking said second region and performing an implant process using a dopant material having negatively charged ions; and performing additional processing to complete said p-type field effect transistor and said n-type field effect transistor, said performing of said additional processing comprising performing at least one thermal process to cause said dopant material to diffuse into said high-k gate dielectric layer of said first gate stack leaving a predetermined concentration of said dopant material at an interface between said high-k gate dielectric layer and said silicon germanium layer in order to selectively reduce a negative threshold voltage of said p-type field effect transistor to between −0.3V and −0.45V.

9. The method according to claim 8, said performing of said implant process comprising, before said forming of said first gate stack and said second gate stack, forming a protective layer on said silicon germanium layer, performing said implant process such that said dopant material is implanted through said protective layer and into said silicon germanium layer without damaging said silicon germanium layer, and removing said protective layer; and, said at least one thermal process causing said dopant material to diffuse directly from said silicon germanium layer into said high-k gate dielectric layer.

10. The method according to claim 9, said forming of said protective layer comprising performing a high temperature oxide deposition process.

11. The method according to claim 8, further comprising, after said forming of said first gate stack and said second gate stack and before said performing of said implant process, forming at least one layer of gate sidewall spacers adjacent to opposing sidewalls of said first gate stack and said second gate stack.

12. The method according to claim 8, said dopant material comprising any of chlorine, bromine and iodine.

13. The method according to claim 8, said dopant material comprising fluorine and said predetermined concentration being between $1\times10^{12}$ atoms/cm$^2$ and $1\times10^{13}$ atoms/cm$^2$.

14. The method according to claim 8, said forming of said first gate stack and said second gate stack being performed such that said first gate stack comprises a near valence band metal gate conductor layer adjacent to said high-k gate dielectric layer said second gate stack comprises a second high-k gate dielectric layer on said substrate over said second region and a near conduction band metal gate conductor layer adjacent to said second high-k gate dielectric layer.

* * * * *

UNITED STATES PATENT AND TRADEMARK OFFICE
CERTIFICATE OF CORRECTION

PATENT NO. : 7,867,839 B2  
APPLICATION NO. : 12/176634  
DATED : January 11, 2011  
INVENTOR(S) : Xiangdong Chen et al.

Page 1 of 1

It is certified that error appears in the above-identified patent and that said Letters Patent is hereby corrected as shown below:

Title page, item [73] should read as follows:

Assignee: International Business Machines Corporation, Armonk, NY (US)  
Freescale Semiconductor Inc., Austin, TX (US)  
Samsung Electronics Co., Ltd., Suwon-Si, Korea, Republic of Korea Signed and Sealed this
Twentieth Day of September, 2011

David J. Kappos
*Director of the United States Patent and Trademark Office*